(12) United States Patent
Aburatani et al.

(10) Patent No.: US 11,424,146 B2
(45) Date of Patent: Aug. 23, 2022

(54) SUBSTRATE PROCESSING APPARATUS AND TEMPERATURE MEASUREMENT UNIT

(71) Applicant: KOKUSAI ELECTRIC CORPORATION, Tokyo (JP)

(72) Inventors: Yukinori Aburatani, Toyama (JP); Shin Hiyama, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 921 days.

(21) Appl. No.: 16/133,058

(22) Filed: Sep. 17, 2018

(65) Prior Publication Data

US 2019/0019699 A1 Jan. 17, 2019

Related U.S. Application Data

(63) Continuation of application No. PCT/JP2017/002535, filed on Jan. 25, 2017.

(30) Foreign Application Priority Data

Mar. 28, 2016 (JP) .............................. JP2016-063144

(51) Int. Cl.
| | |
|---|---|
| *H01L 21/67* | (2006.01) |
| *H01L 21/677* | (2006.01) |
| *H01L 21/687* | (2006.01) |
| *G01K 7/06* | (2006.01) |

(Continued)

(52) U.S. Cl.
CPC .......... *H01L 21/67248* (2013.01); *G01K 7/06* (2013.01); *H01L 21/6719* (2013.01);

(Continued)

(58) Field of Classification Search
CPC ......... H01L 21/67248; H01L 21/67781; H01L 21/6719; H01L 21/68771; H01L 21/67103;

(Continued)

(56) References Cited

U.S. PATENT DOCUMENTS 4,788,416 A 11/1988 Price et al.
6,084,215 A * 7/2000 Furuya .............. H01L 21/67248
219/444.1

(Continued)

FOREIGN PATENT DOCUMENTS

JP 63-227013 A 9/1988
JP 10-48063 A 2/1998

(Continued)

OTHER PUBLICATIONS

International Search Report for PCT/JP2017/002535, dated Apr. 25, 2017.

*Primary Examiner* — Lisa M Caputo
*Assistant Examiner* — Janice M Soto
(74) *Attorney, Agent, or Firm* — Volpe Koenig

(57) ABSTRACT

There is provided a technique capable of easily improving accuracy of temperature measurement of a substrate, regardless of a film formation state of the substrate. There is provided a substrate processing apparatus including a substrate mounting table having a mounting surface on which a substrate is mounted, a heater configured to heat the substrate mounted on the mounting surface, and an elastically deformable temperature sensor whose leading end portion constitutes a temperature detection part. The temperature sensor is configured to extend from below the mounting surface to above the mounting surface, and the leading end portion protrudes from the mounting surface.

13 Claims, 13 Drawing Sheets

(51) Int. Cl.
*H01L 21/683* (2006.01)
*G01K 1/14* (2021.01)
(52) U.S. Cl.
CPC .. *H01L 21/67103* (2013.01); *H01L 21/67253* (2013.01); *H01L 21/67781* (2013.01); *H01L 21/6838* (2013.01); *H01L 21/68707* (2013.01); *H01L 21/68771* (2013.01); *G01K 1/14* (2013.01)
(58) Field of Classification Search
CPC ........... H01L 21/67253; H01L 21/6838; H01L 21/68707; H01L 21/67098; H01L 21/67742; H01L 22/12; H01L 21/67766; H01L 21/67383; H01L 21/67242; G01K 7/06; G01K 1/14
USPC ........................................................ 374/179
See application file for complete search history.

(56) References Cited

U.S. PATENT DOCUMENTS

| 2003/0206573 | A1* | 11/2003 | Gotthold | G01J 5/0003 374/132 |
| 2006/0275933 | A1* | 12/2006 | Du Bois | G01K 1/16 438/14 |
| 2013/0012035 | A1 | 1/2013 | Aburatani et al. | |

FOREIGN PATENT DOCUMENTS

| JP | 2013-33946 A | 2/2013 |
| JP | 2015-59833 A | 3/2015 |

* cited by examiner

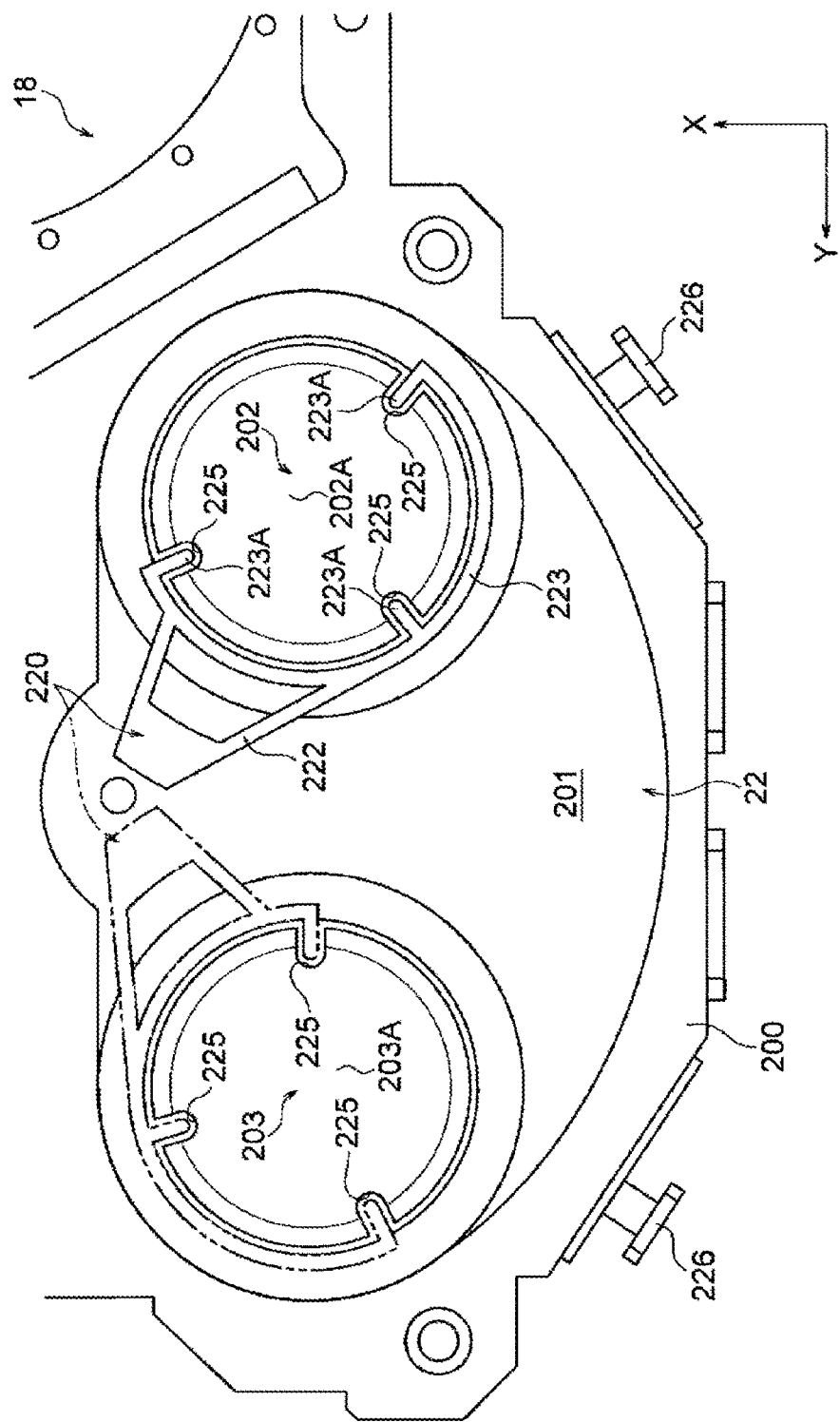

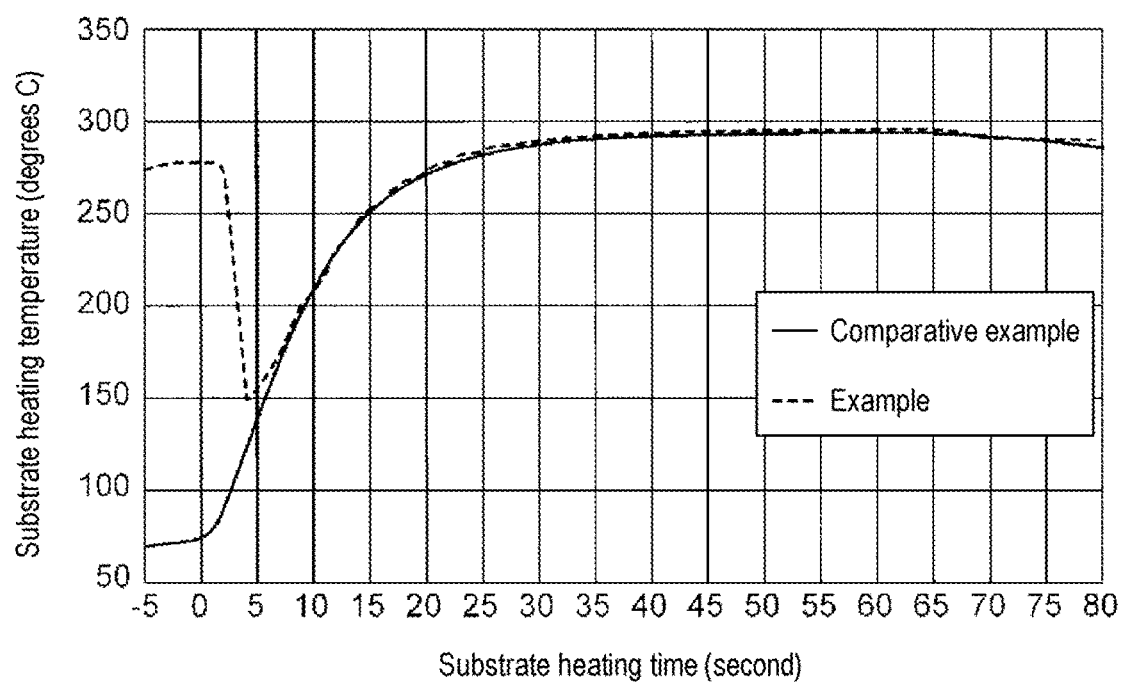

SUBSTRATE PROCESSING APPARATUS AND TEMPERATURE MEASUREMENT UNIT

CROSS-REFERENCE TO RELATED APPLICATION(S)

This application is a Bypass Continuation Application of PCT international Application No. PCT/JP2017/002535, filed on Jan. 25, 2017 and designating the United States, the international application being based upon and claiming the benefit of priority from Japanese Patent Application No. 2016-063144, filed on Mar. 28, 2016, the entire content of which is incorporated herein by reference.

TECHNICAL FIELD

The present disclosure relates to a substrate processing apparatus and a temperature measurement unit.

BACKGROUND

In the related art, there has been a substrate processing apparatus that performs heat treatment on a substrate, and a method of manufacturing a semiconductor device using the substrate processing apparatus. Due to the progress of the miniaturization of integrated circuit patterns and high integration due to low temperature processing, accurate temperature measurement and temperature control during substrate processing have been needed. As a temperature measuring method, there is generally a non-contact temperature measuring method using a radiation thermometer or a contact temperature measuring method using a thermocouple embedded in a support member of a substrate being processed.

In the non-contact temperature measuring method, when a silicon substrate is used as a substrate, since the transmission amount of a wavelength, which is measured by the radiation thermometer at a low temperature, increases due to the properties of the silicon substrate, it is difficult to measure a low temperature range of the silicon substrate. Even in a radiation thermometer of a short wavelength whose transmission amount at the silicon substrate is small, it is also difficult to measure a low temperature range. In addition, since the emissivity of the substrate varies depending on a film formation state of the substrate, it is necessary to change the emissivity for each substrate whose temperature is measured.

On the other hand, in the contact temperature measuring method, the support member in which the thermocouple is embedded is required to have hardness, heat resistance and cleanliness, and as a result, ceramics is used. Generally, since the heat capacity of ceramics is large and the sensitivity of temperature measurement of a substrate deteriorates when the support member is interposed, accurate temperature measurement is difficult. Moreover, since the support member is heated by a heat source, accurate temperature measurement of the substrate is difficult due to a thermal effect from the support member.

SUMMARY

Some embodiments of the present disclosure provide a technique capable of easily, improving accuracy of temperature measurement of a substrate, regardless of a film formation state of the substrate.

According to one embodiment of the present disclosure, there is provided a substrate processing apparatus including a substrate mounting table having a mounting surface on which a substrate is mounted, a heater configured to heat the substrate mounted on the mounting surface, and an elastically deformable temperature sensor whose leading end portion constitutes a temperature detection part. The temperature sensor is configured to extend from below the mounting surface to above the mounting surface, and the leading end portion protrudes from the mounting surface.

BRIEF DESCRIPTION OF DRAWINGS

FIG. 9 is a plan view of the process chamber illustrated in FIG. 3.

FIG. 14 is a diagram showing a relationship between a substrate heating time and a substrate heating temperature and illustrating the substrate processing method according to the present embodiment.

DETAILED DESCRIPTION

Figure 1:
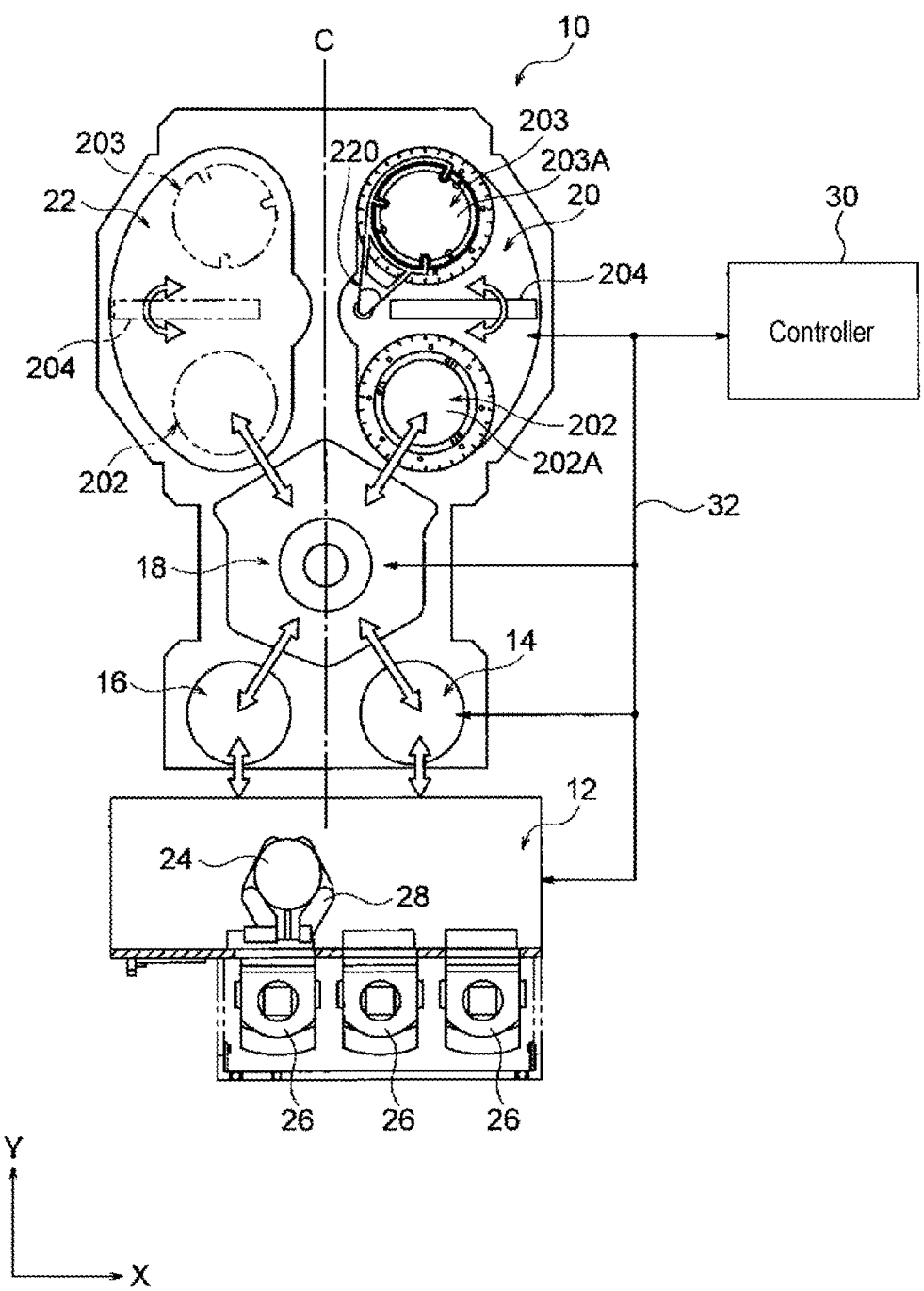
FIG. 1 is a schematic plan view of a substrate processing apparatus according to one embodiment of the present disclosure.

A substrate processing apparatus, a substrate processing method, and a substrate processing program according to one embodiment of the present disclosure will now be described with reference to FIGS. 1 to 14. Further, as illustrated appropriately in the drawings, the direction of an arrow X indicates one direction of the horizontal direction and the direction of an arrow Y indicates the other direction horizontally orthogonal to the direction of the arrow X. In addition, the direction of an arrow Z indicates an upward direction orthogonal to the direction of the arrow X and the direction of the arrow Y.

[Overall Schematic Configuration of the Substrate Processing Apparatus]

Figure 2:
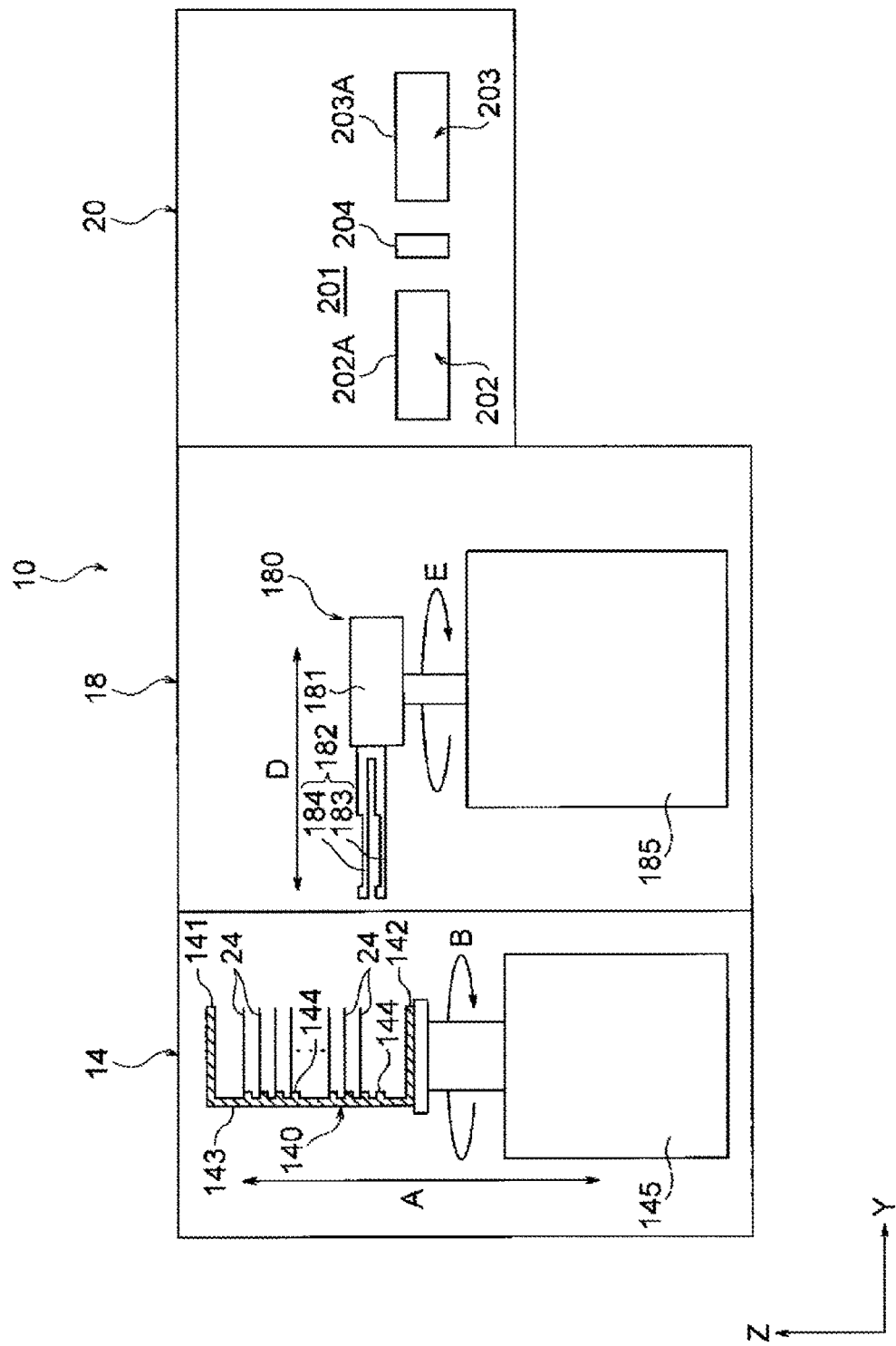
FIG. 2 is a schematic side view of the substrate processing apparatus illustrated in FIG. 1.

As illustrated in FIGS. 1 and 2, a substrate processing apparatus 10 according to the present embodiment includes an atmospheric transfer chamber (equipment front end module: EFEM) 12, load lock chambers 14 and 16, a transfer chamber 18, and process chambers 20 and 22. The atmospheric transfer chamber 12, the load lock chambers 14 and 16, the transfer chamber 18, and the process chambers 20 and 22 are sequentially arranged in the direction of the arrow Y.

As illustrated in FIG. 1, carriers 26 for transferring substrates 24 to be processed are arranged in the atmospheric transfer chamber 12. A pod (front opening unified pod: FOUP) is used in the carriers 26. Also, each of the carriers 26 is configured to accommodate, for example, up to twenty-five substrates 24, at a regular interval in the vertical direction. In the atmospheric transfer chamber 12, an atmospheric robot 28 for transferring the substrates 24 to/from the load lock chambers 14 and 16 is installed. In the present embodiment, semiconductor wafers for manufacturing a semiconductor device, such as silicon wafers, are used as the substrates 24.

Each of the load lock chambers 14 and 16 is installed to face the atmospheric transfer chamber 12. As illustrated in FIG. 2, a substrate support 140, which is configured to accommodate, for example, 25 substrates 24, at a regular interval in the vertical direction, is disposed in one load lock chamber 14. The substrate support 140 includes an upper plate 141 and a lower plate 142, which are arranged to face each other in the vertical direction, and a post 143, which connects the upper plate 141 and the lower plate 142. Accommodation portions 144, which are formed to protrude inward at a regular interval in the longitudinal direction, are arranged on the inner side of the post 143. The substrate 24 is loaded on each of the accommodation portions 144 to be accommodated in the substrate support 140.

A support driving part 145 is configured to move the substrate support 140 up and down in the direction of the arrow A and rotate the substrate support 140 in the horizontal direction of the arrow B direction. The other load lock chamber 16 has the same configuration as the one load lock chamber 14.

As illustrated in FIGS. 1 and 2, the transfer chamber 18 is installed to face a side of the load lock chambers 14 and 16, which is an opposite side of the atmospheric transfer chamber 12, on a virtual central axis C. In the transfer chamber 18, a vacuum robot 180 for transferring the substrates 24 to/from the load lock chambers 14 and 16 and to/from the process chambers 20 and 22 is installed. The vacuum robot 180 includes an arm 181 having a finger portion 182. Although not shown here, two arms 181 are installed. The finger portion 182 is configured with a lower finger 183 and an upper finger 184, so as to simultaneously transfer two substrates 24 accommodated at upper and lower sides in the substrate support 140.

In the vacuum robot 180, the arm 181 is configured to move the finger portion 182 horizontally in the direction of the arrow D, and an arm driving part 185 is configured to rotate the arm 181 horizontally in the direction of the arrow E.

As illustrated in FIG. 1, the process chambers 20 and 22 are installed to face a side of the transfer chamber 18, which is an opposite side of the load lock chambers 14 and 16. As illustrated in FIGS. 1 and 2, the one process chamber 20 has a reaction chamber 201, and two substrate mounting parts (substrate mounting tables) 202 and 203 are arranged in the same space of the reaction chamber 201 along the direction of the arrow Y. A partition portion 204 is disposed between the substrate mounting part 202 and the substrate mounting part 203, and is configured to partition the reaction chamber 201. The other process chamber 22 has the same configuration as the one process chamber 20. The process chambers 20 and 22 are mainly made of, for example, aluminum. Also, the process chambers 20 and 22 may be mainly made of metal or an alloy other than aluminum as long as the same function can be obtained.

In addition, as illustrated in FIG. 1, the substrate processing apparatus 10 includes a controller 30. The controller 30 is connected to each component of the substrate processing apparatus 10, such as the atmospheric transfer chamber 12 and the like, via a cable 32, and the overall operation of the substrate processing apparatus 10 is controlled by the controller 30. Although not shown, the controller 30 is configured with a storage medium and, a computer (CPU). In the controller 30, a substrate processing program stored in the storage medium is executed by the computer so that the operation of the substrate processing apparatus 10 is controlled. As the storage medium, for example, a hard disk, a semiconductor memory device (for example, random access memory: RAM) or the like is used. Also, each component of the substrate processing apparatus 10 and the controller 30 may be wirelessly connected.

[Detailed Configuration of the Process Chamber]

Figure 3:
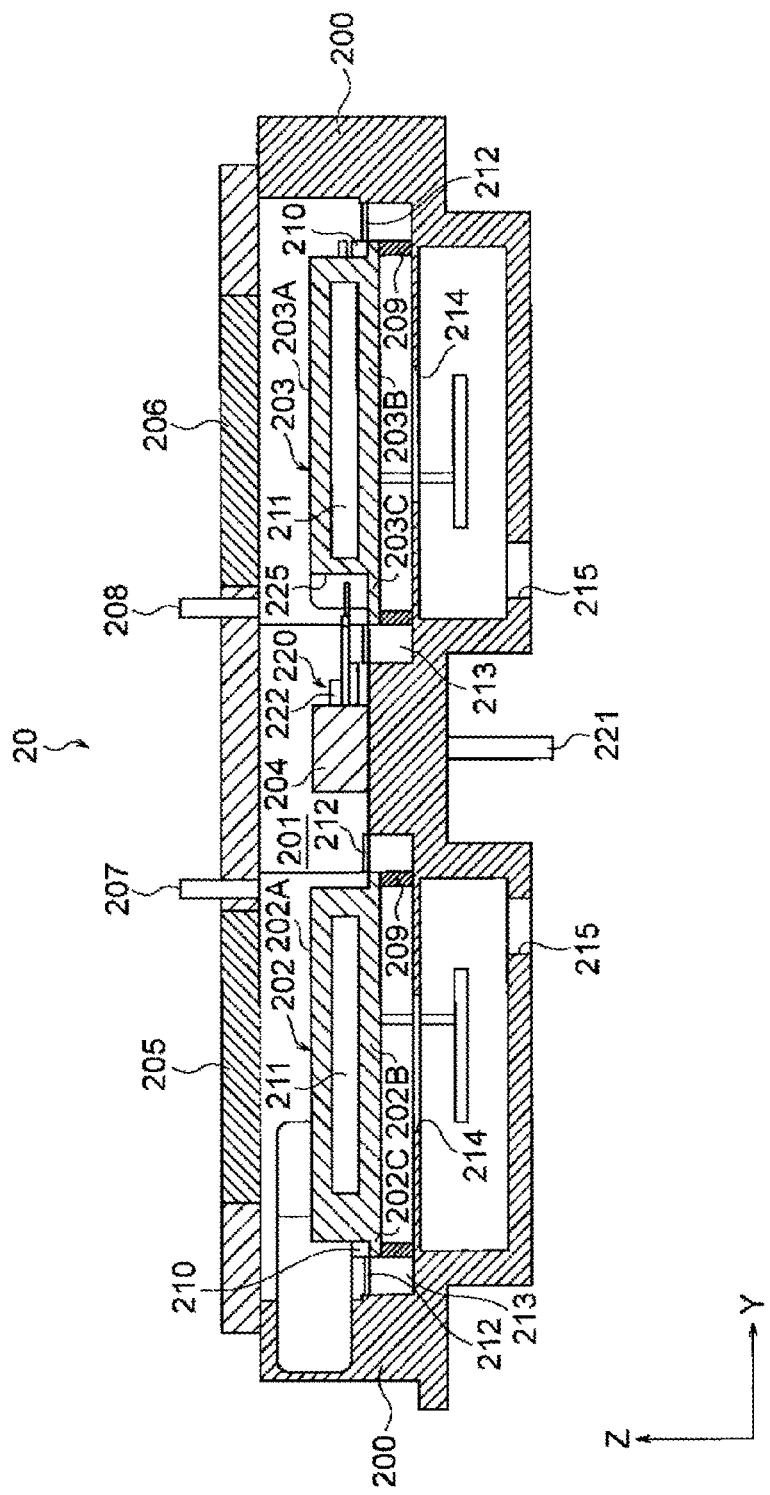
FIG. 3 is an enlarged cross sectional view of a process chamber of the substrate processing apparatus illustrated in FIG. 1.
Figure 4:
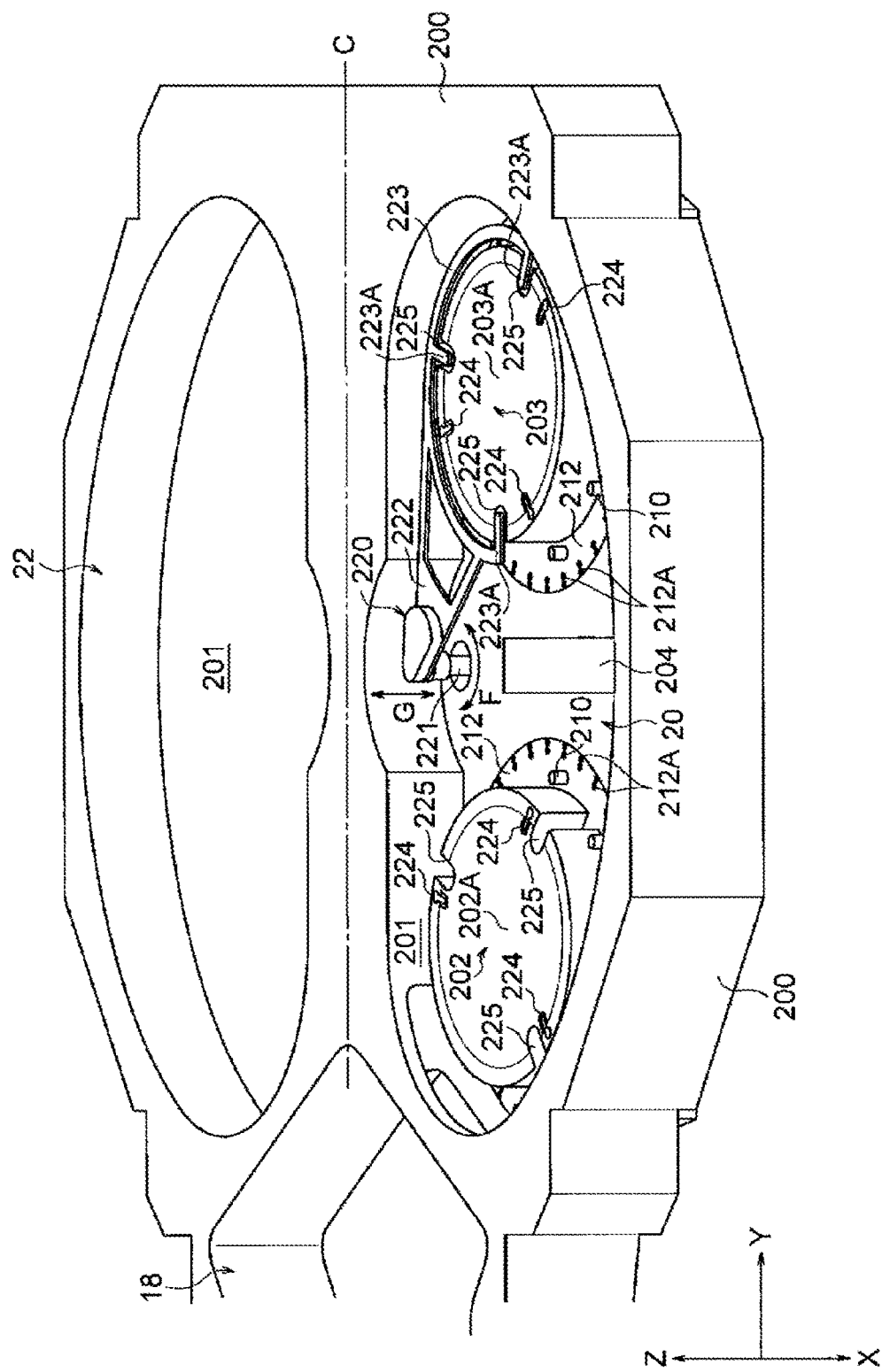
FIG. 4 is an enlarged perspective view of the process chamber illustrated in FIG. 3.

Next, the process chambers 20 and 22 will be described in detail. As illustrated in FIGS. 1, 3 and 4, the reaction chamber 201, which is formed in a semicircular shape when viewed a plane and in a concave shape when viewed in a side in a reaction chamber main body 200, is disposed in the one process chamber 20. The partition portion 204 having a prismatic shape, which crosses in the direction of the arrow X, is detachably arranged in the intermediate portion of the reaction chamber 201 in the direction of the arrow Y. In the reaction chamber 201, the substrate mounting parts 202 and 203 are respectively arranged on both sides of the partition portion 204 as a center. The partition portion 204 is made of aluminum in the embodiment. The partition portion 204 may also be made of quartz, aluminum oxide, or the like. One substrate 24 can be processed in the substrate mounting part 202 and another substrate 24 can be processed in the substrate mounting part 203. Accordingly, two substrates 24 can be processed in the process chamber 20.

As illustrated in FIG. 3, a lid portion 205 is disposed at a position corresponding to the top of the substrate mounting part 202 of the reaction chamber main body 200, and a lid portion 206 is disposed at a position corresponding; to the top of the substrate mounting part 203 of the reaction chamber main body 200. A supply pipe 207 leading from the outside to the reaction chamber 201 is arranged near the lid portion 205 of the reaction chamber main body 200. Similarly, a supply pipe 208 is arranged near the lid portion 206 of the reaction chamber main body 200. The supply pipes 207 and 208 supply a gas for processing; the substrates 24 from the outside into the reaction chamber 201. Furthermore, the reaction chamber 201 is connected to a vacuum pump (not shown), so that a vacuum atmosphere of, for example, 0.1 Pa or less can be generated using the vacuum pump.

The one substrate mounting part 202 has a cylindrical shape whose height is lower than its diameter. The upper surface of the substrate mounting part 202 toward the lid portion 205 side is configured as a circular mounting surface 202A on which the substrate 24 is mounted. The height of the mounting surface 202A is set lower than the height of the reaction chamber 201. A flange 202C protruding around the outer circumference is installed at a bottom 202E of the substrate mounting part 202, and the substrate mounting part 202 is supported by a post 209 via the flange 202C. As illustrated in FIGS. 3 and 4, the flange 202C is fixed to the post 209 using a fixing member 210, and the substrate mounting part 202 is installed in the reaction chamber main body 200.

Similarly, the other substrate mounting part 203 has the same cylindrical shape as the substrate mounting part 202. The upper surface of the substrate mounting part 203 toward the lid portion 206 side is configured as a circular mounting, surface 203A on which the substrate 24 is mounted. The height of the mounting surface 203A is set lower than the height of the reaction chamber 201. A flange 203C protruding around the outer circumference is installed at a bottom 203B of the substrate mounting part 203, and the substrate mounting part 203 is supported by the post 209 via the flange 203C. As illustrated in FIGS. 3 and 4, the flange 203C is fixed to the post 209 using the fixing member 210, and the substrate mounting part 203 is installed in the reaction chamber main body 200.

As illustrated in FIG. 3, a heating part 211 is embedded in the substrate mounting part 202, and a heating part 211 is similarly embedded in the substrate mounting, part 203. For example, a heater is used as the heating part 211, and the heating parts 211 are configured to heat the substrates 24 mounted on the mounting surfaces 202A and 203A to a processing temperature. In the present embodiment, the processing temperature of the substrates 24 can be raised to, for example 450 degrees C. using the heating parts 211.

A rectifying exhaust baffle ring 212 having a ring shape when viewed in a plan is disposed in the substrate mounting part 202 so as to surround the periphery of the side surface of the substrate mounting part 202. Similarly, a rectifying exhaust baffle ring 212 having a ring shape is disposed in the substrate mounting part 203 so as to surround the periphery of the side surface of the substrate mounting part 203. A plurality of exhaust holes 212A, which penetrates in a plate thickness direction, is formed in each of the rectifying exhaust baffle rings 212. A first exhaust port 213 is arranged along the periphery of the side surface of the substrate mounting part 202 and along the periphery of the side surface of the substrate mounting part 203. The exhaust boles 212A are formed such that an exhaust gas after the processing of the substrates 24 can be exhausted to the first exhaust port 213.

In the reaction chamber main body 200, a second exhaust port 214 and a third exhaust port 215 are sequentially arranged under the substrate mounting part 202. Similarly, a second exhaust port 214 and a third exhaust port 215 are sequentially arranged under the substrate mounting part 203. The second exhaust port 214 is connected to the first exhaust port 213, and the third exhaust port 215 is connected to the second exhaust port 214. Accordingly, an exhaust path extending from the exhaust holes 212A to the third exhaust port 215 via the first exhaust ports 213 and the second exhaust ports 214 is established.

As illustrated in FIGS. 3 and 4, a robot arm 220 as a transfer mechanism is disposed in the reaction chamber 201. The robot arm 220 is configured with a shaft portion 221 whose axial direction is the direction of the arrow Z and an arm 222 for transferring the substrates 24. The shaft portion 221 has a two-axis configuration which horizontally rotates in the direction of the arrow F and moves up and down in the direction of the arrow G, and is connected to a driving part (not shown).

One end of the arm 222 is connected to the shaft portion 221, and a finger 223 is, installed in the other end of the arm 222. The finger 223 has a circular arc shape whose radius is larger than the radius of the substrates 24 and the radius of the substrate mounting parts 202 and 203 when viewed in a plane. Support portions (claw portions) 223A, which protrude from each of one end portion, the intermediate portion, and the other end portion of the finger 223 toward the center portion of the finger 223 and further extend inward from the periphery of the side surfaces of the substrate mounting parts 202 and 203, are integrally formed in the finger 223. In the present embodiment, the support portions 223A are formed at three positions of the finger 223 at intervals of 120 degrees with the center portion of the finger 223 as the center of the rotation angle. The finger 223 is made of, for example, alumina ceramics.

The robot arm 220 is configured to support the substrate 24 by using the support portions 223A of the finger 223, and transfer the substrate 24 transferred to the mounting surface 202A of the substrate mounting part 202 to the mounting surface 203A of the substrate, mounting part 203. Conversely, the robot arm is also configured to transfer (withdraw) the substrate 24 transferred to the mounting surface 203A to the mounting surface 202A after the substrate processing.

The robot arm 220 and the partition portion 204 are arranged in the reaction chamber 201 and are configured not to completely separate the internal space of the reaction chamber 201. That is, as illustrated in FIG. 3, the process chamber 20 is configured to allow the gas supplied from the supply pipes 207 and 208 to smoothly flow to the substrate 24 on the mounting surface 202A and the substrate 24 on the mounting, surface 203A. The process chamber 20 is also configured to smoothly exhaust the exhaust gas after the substrate processing through each of the exhaust holes 212A, the first exhaust port 213, the second exhaust port 214, and the third exhaust port 215.

Figure 5:
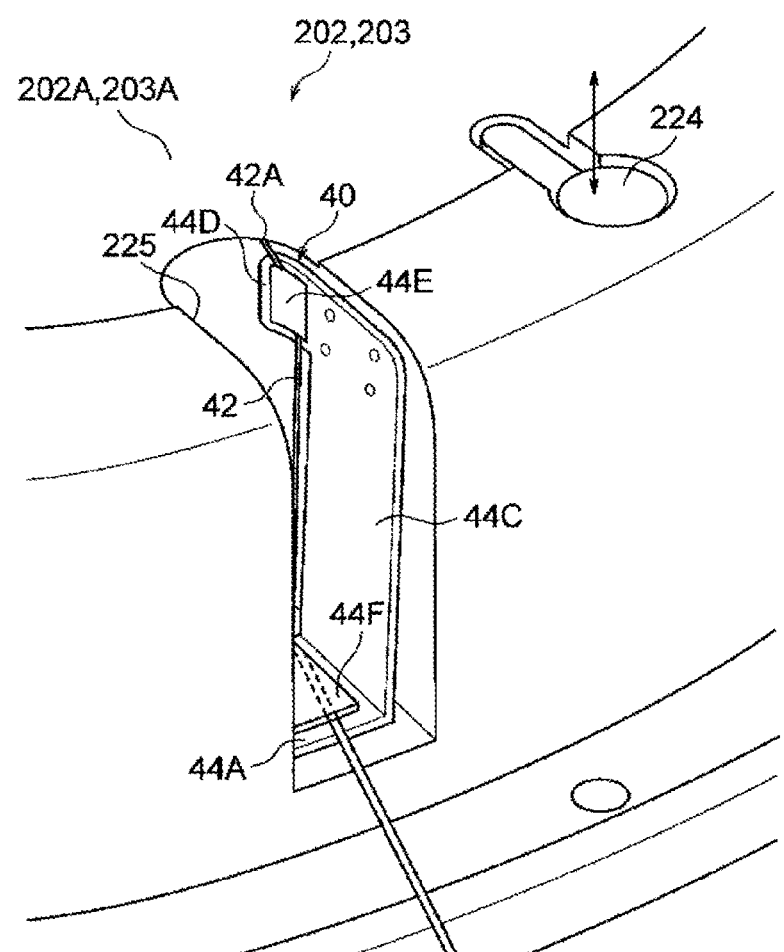
FIG. 5 is an enlarged perspective view of an essential part illustrating a temperature measurement part disposed in a substrate processing part of the process chamber illustrated in FIGS. 3 and 4.

As illustrated in FIG. 5, a substrate holding pin 224, which is vertically lifted and lowered in direction of the arrow Z, is installed in a peripheral edge portion of the mounting surface 202A of the substrate mounting part 202. As illustrated in FIG. 4, substrate holding pins 224 (here, three substrate holding pins) are arranged at equal intervals in the peripheral edge portion of the mounting surface 202A. Similarly, three substrate holding pins 224 are installed in a peripheral edge portion of the mounting surface 203A of the substrate mounting part 203. The substrate holding pins 224 are configured to protrude from the mounting surface 202A or from the mounting surface 203A so that the substrate 24 is delivered or held.

As illustrated in FIG. 3 to FIG. 5, storage parts 225 are disposed at positions which correspond to side surface portions of the substrate mounting part 202 and correspond to the support portions 223A of the finger 223 when viewed in a plane. Each of the storage parts 225 is configured to store each of the support portions 223A in the movement of the arm 222 in a direction perpendicular to the mounting surface 202A to prevent interference between the support portions 223A and the substrate mounting part 202. In the present embodiment, the storage part 225 has a U shape which is substantially the same as the shape of and has a size larger than the support portion 223A when viewed in a plane, and is formed by a U groove (a U-shaped notch portion) whose vertical direction is the longitudinal direction. The number of arranged storage parts 225 is set equal to the number of arranged support portions 223A, and three storage pans 225 are arranged in the embodiment. On the other hand, storage parts 225 are similarly arranged in the side surface portions of the substrate mounting part 203. The shape of the storage parts 225 is not particularly limited but may also be a groove (a notch portion) such as a semicircular groove, a trapezoidal groove, a triangular groove, a rectangular groove or the like. In addition, if the number of arranged support portions 223A is four or more, the number of arranged storage parts 225 is also set to the same number (i.e., four or more).

As illustrated in FIG. 1, the other process chamber 22 has the same configuration as the one process chamber 20, and therefore, a description thereof will be omitted here.

[Detailed Configuration of the Temperature Measurement Part]

Figure 6:
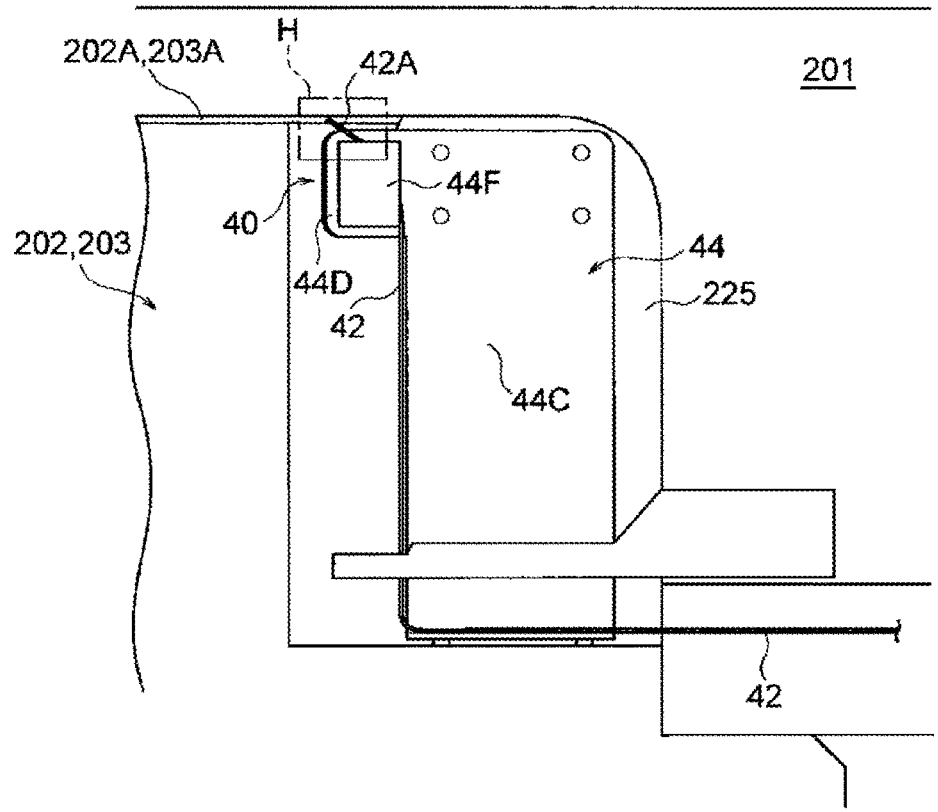
FIG. 6 is a side view (left side view) of the temperature measurement part illustrated in FIG. 5.
Figure 7:
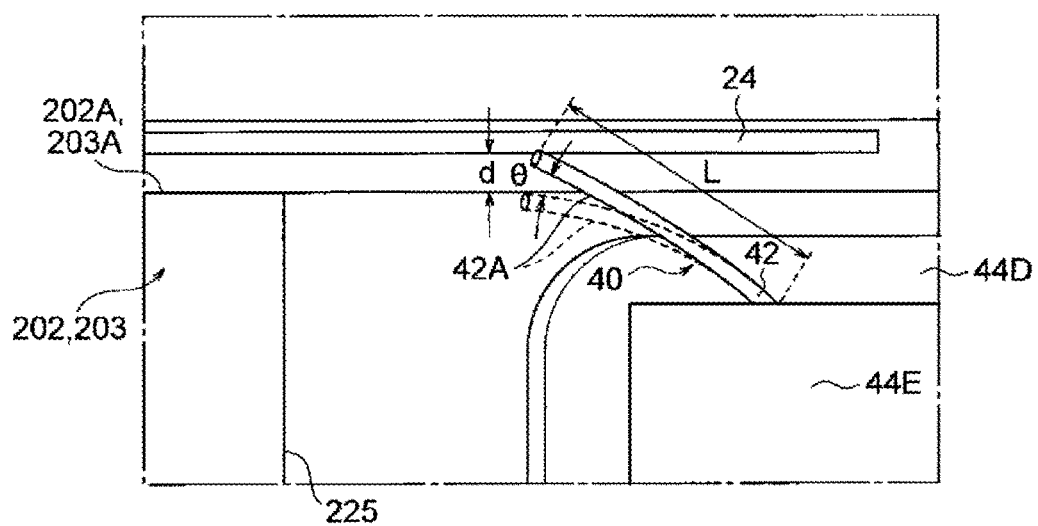
FIG. 7 is an enlarged side view (enlarged side view of a reference symbol H portion illustrated in FIG. 6) illustrating a temperature sensor of the temperature measurement part illustrated in FIG. 6.
Figure 8A:
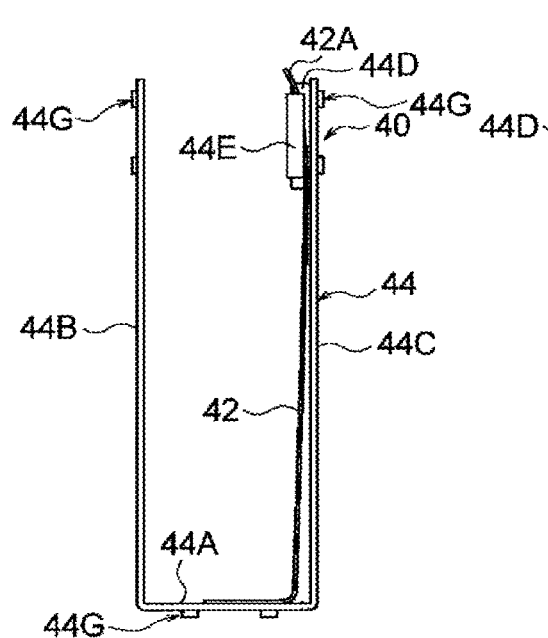
FIG. 8A is a front view of the temperature measurement part illustrated in FIG. 5.
Figure 8B:
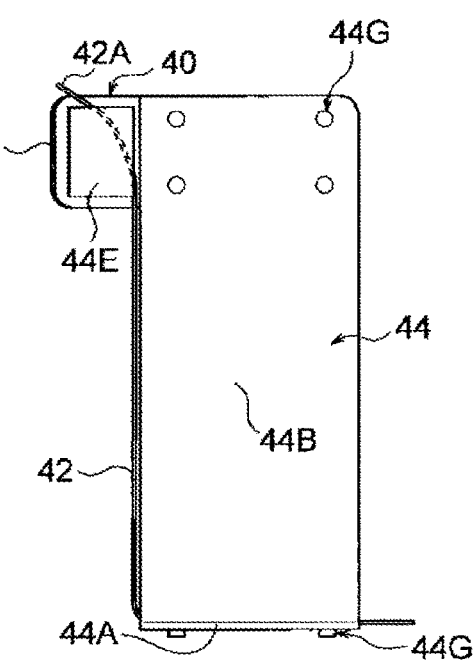
FIG. 8B is a tell side view of the temperature measurement part.
Figure 8C:
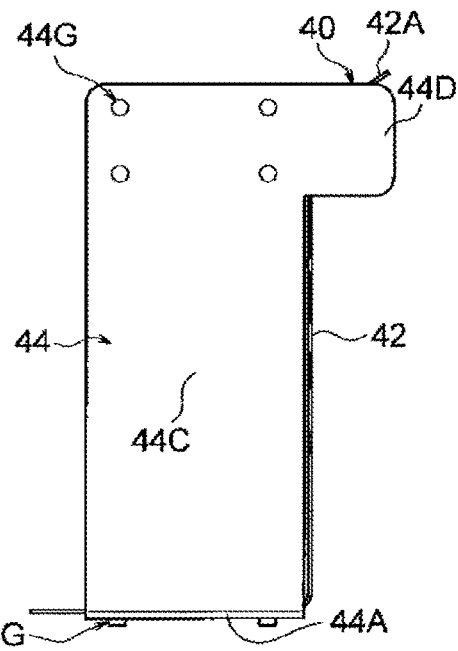
FIG. 8C is a right side view of the temperature measurement part.
Figure 8D:
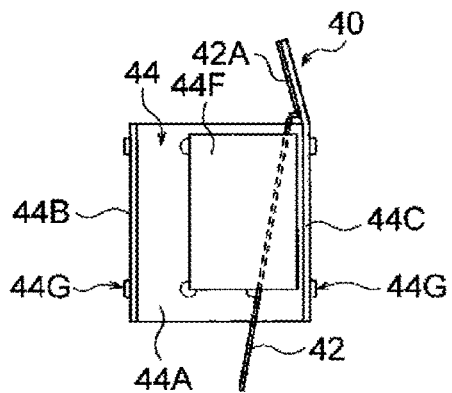
FIG. 8D is a plan view of the temperature measurement part.

As illustrated in FIGS. 5 to 7, in each of the process chambers 20 and 22, a temperature measurement part (temperature measurement unit) 40 is disposed in the storage part 225 of the substrate mounting part 202 and the storage pan 225 of the substrate mounting part 203. At least one temperature measurement part 40 is disposed in the substrate mounting part 202 and at least one temperature measurement part 40 is disposed in the substrate mounting part 203. Also, three temperature measurement pans 40 may be disposed in each of the substrate mounting part 202 and the substrate mounting part 203. More specifically, the temperature measurement part 40 is configured with an elastically deformable temperature sensor 42 in which a leading end portion 42A, which is a temperature detection part (temperature sensing part), protrudes from the mounting surface 202A or from the mounting surface 203A, and an installation member (base) 44 for installing the temperature sensor 42 to be fixed to the storage part 225.

Although a detailed structure of the temperature sensor 42 is omitted, the temperature sensor 42 is configured with a sheath thermocouple in which a thermocouple wire is inserted in a heat resistant metal pipe and an inorganic insulator is filled in the heat resistant metal pipe. The thermocouple wire is inserted up to the leading end of the heat resistant metal pipe, and the leading end portion 42A, which is the leading end of the heat resistant metal pipe, constitutes the temperature detection pan (temperature sensing part). The heat resistant metal pipe is made of, for example, a nickel alloy, and the diameter of the heat resistant metal pipe is set to 0.5 mm or less, specifically 0.15 mm which is very fine. Also, the heat resistant metal pipe may be made of stainless steel. The smaller the heat capacity of the temperature sensor 42, the better the transient response. Therefore, it is desirable that the temperature sensor 42 be thinner and be smaller in heat capacity. As illustrated in FIG. 7, a protrusion amount d of the leading end portion 42A of the temperature sensor 42 is set to 0.3 to 0.7 mm from the mounting surface 202A or the mounting surface 203A, and is set to 0.5 mm here. The protrusion amount d is set based on a deflection amount δ of the leading end portion 42A of the temperature sensor 42, ease of the installation in the installation member 44 or the adjustment of the protrusion amount d, or the like.

Furthermore, the protrusion direction of the leading end portion 42A faces the center direction of the mounting surface 202A or the mounting surface 203A and the direction of the arrow Z so as to be inclined at 10 to 45 degrees, here, at an angle θ of 30 degrees, with respect to the mounting surface 202A or the mounting surface 203A (horizontal surface). By setting the leading end portion 42A to have the protrusion amount d and to the angle θ, it is possible to deflect the leading end portion 42A within a range of elastic deformation (within a range in which plastic deformation does not occur).

As illustrated in FIGS. 5, 6, and 8A to 8D, the installation member 44 includes a bottom plate 44A, and a pair of sidewall plates 44B and 44C respectively erected from both ends of the bottom plate 44A, and has a U shape when viewed in a side. The installation member 44 is formed of, for example, a stainless steel plate, and the sidewall plates 44B and 44C are shaped by bending both ends of the bottom plate 44A. The sidewall plate 44B is fixed to one groove wall of the U groove of the storage part 225, and the sidewall plate 44C is fixed to the other groove wall of the U groove. In the formation by bending the both ends of the bottom plate 44A, when it is, formed to have the inner bending angle slightly larger than 90 degrees, the sidewall plates 44B and 44C can be fixed to the storage part 225 so that they are pressed against the inside of the U groove of the storage part 225 by an elastic force of the installation member 44.

A fixing portion 44D protruding toward the center portion of the mounting surface 202A or the mounting surface 203A is integrally formed in the upper portion of the sidewall plate 44C, in which the fixing portion 44D is bent toward the sidewall plate 44B side and spaced apart from the other groove wall of the U groove. In addition, protrusion portions 44G, which are protrusion-shape support portions, are formed in the bottom plate 44A and the sidewall plates 44B and 44C, respectively. The bottom plate 44A and the sidewall plates 44B and 44C are structured to be supported and fixed by making contact with the U groove of the storage part 225 via the protrusion portions 44G.

Figure 10:
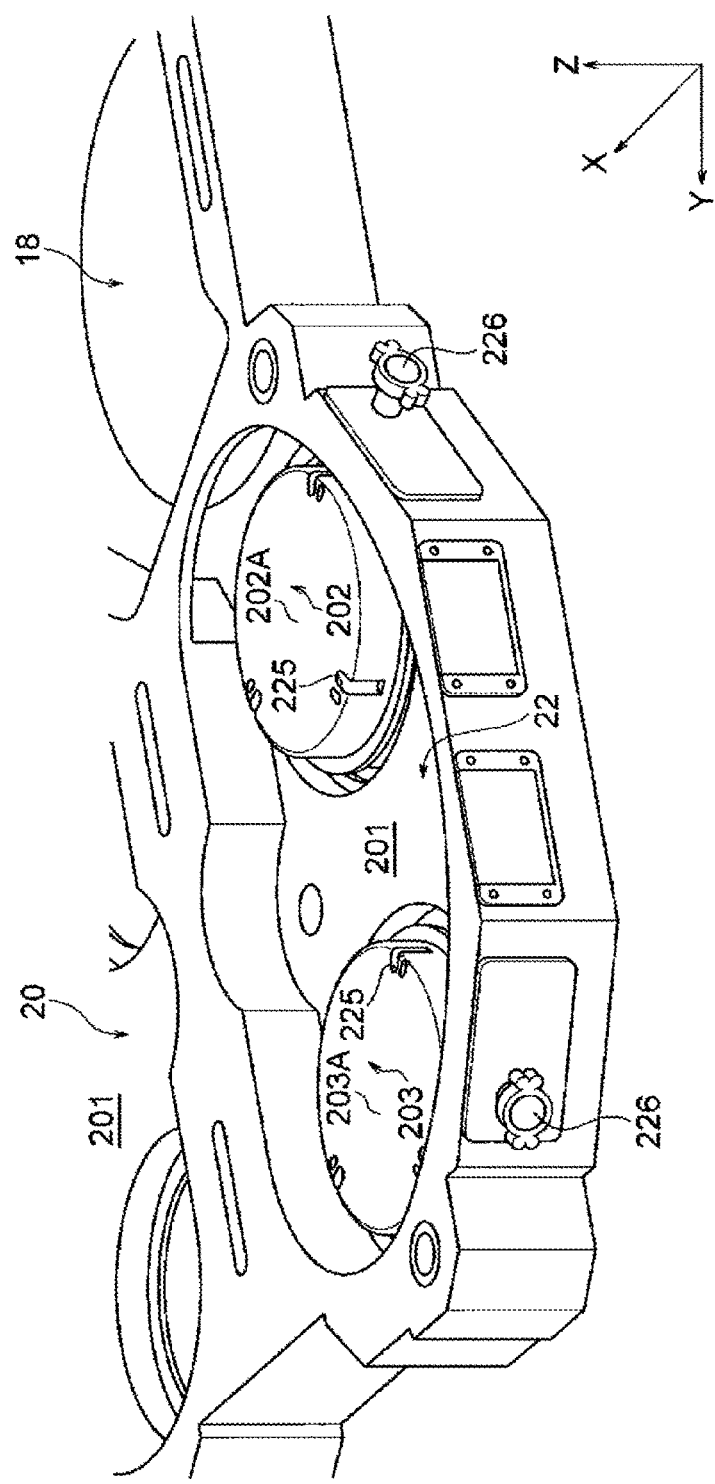
FIG. 10 is a perspective view of the process chamber corresponding to FIG. 9.

The leading end portion 42A of the temperature sensor 42 is installed on the surface of the fixing portion 44D toward the sidewall plate 44B side. The leading end portion 42A is sandwiched and fixed between the fixing portion 44D and a holding plate 44E. Although not shown, a groove portion for holding the leading end portion 42A is installed in the holding plate 44E, and the holding plate 44E is joined to the fixing portion 44D by welding in a state where the leading end portion 42A is inserted into the groove portion. Furthermore, the temperature sensor 42 is drawn downward from the leading end portion 42A along the side of the sidewall plate 44C, and is inserted into the bottom plate 44A by using a holding plate 44F at the intermediate portion. The holding plates 44E and 44F are formed of, for example, stainless steel sheets and are joined to the firing portion 44D or the bottom plate 44A by spot welding. This makes it possible to fix the temperature sensor 42 without giving thermal damage to the temperature sensor 42 which is very thinly formed. As illustrated in FIGS. 9 and 10, the temperature sensor 42 is drawn out to the outside of the reaction chamber 201 via an output port 226 disposed in the side portion of the reaction chamber main body 200. The temperature sensor 42 is finally connected to the controller 30 illustrated in FIG. 1.

In the temperature measurement part 40, when the substrate 24 is held on the mounting surface 202A or the mounting surface 203A, it is configured such that the leading end portion 42A of the temperature sensor 42 makes contact, with the rear surface of the substrate 24 and is bent by an amount corresponding to the protrusion amount d of the leading end portion 42A due to the weight of the substrate 24 itself. The leading end portion 42A is further moved (elastically deformed) downward than the mounting surface 202A or the mounting surface 203A by bending, and is stored in the storage pan 225. Therefore, even if the leading end portion 42A protrudes, since the leading end portion 42A is bent, the substrate 24 can be accurately held on the mounting surface 202A or the mounting surface 203A without any gap, and in a state in which the substrate 24 is held on the mounting surface 202A or the mounting surface 203A, the leading end portion 42A and the rear surface of the substrate 24 can always be brought into contact with each other. In addition, since it is configured such that a portion corresponding to the protrusion amount d of the leading end portion 42A is bent only by the weight of the substrate 24 itself, there is no need to further install a mechanism for fixing the substrate 24 to the mounting surface 202A or 203A even if the leading end portion 42A protrudes from the mounting surface 202A or 203A. Furthermore, the temperature measurement part 40 is configured so as not to interfere with the support portions 223A when the finger 223 is moved up and down.

Here, a length (span length) L from the installation position (holding position between the fixing position 44D and the holding plate 44E) of the leading end portion 42A of the temperature sensor 42 illustrated in FIG. 7 to the foremost end is calculated using equation (1) for calculating a deflection amount δ of a cantilever support beam and equation (2) for calculating a geometrical moment of inertia I.

$$\delta = PL^3/3EI \qquad \text{Eq. (1)}$$

$$I = \pi D^4/64 \qquad \text{Eq. (2)}$$

The calculation conditions are that the heat resistant metal pipe of the temperature sensor 42 is made of, for example, a stainless steel material, the diameter of the substrate 24 is set to 300 mm, and an acting, force P from the substrate 24 applied to the leading end portion 42A is set to ⅕ of the mass of the substrate 24. Assuming that the amount of deflection amount δ is 0.5 mm, the acting force P is 0.27 N, the Young's modulus E is $200 \times 10^3$ N/mm², and the diameter D of the heat resistant metal pipe is 0.25 mm, then the length L is 5 [Mm]. Considering the allowable range, the length L is set to 4 to 6 [mm].

[Substrate Processing Method, Method of Manufacturing Semiconductor Device, and Substrate Processing Program]

Next, a substrate processing method using the aforementioned substrate processing apparatus 10 will be described, together with a method of manufacturing a semiconductor device, and a substrate processing program. In the substrate processing apparatus 10, the substrates 24 are transferred from the carrier 26 of the atmospheric transfer chamber 12 illustrated in FIG. 1 to the load lock chambers 14 and 16 using the atmospheric robot 28. The substrates 24 are semiconductor wafers used for manufacturing a semiconductor device. For example, a semiconductor device is formed on the surfaces of the substrates 24. The transferred substrates 24 are transferred to and stored in the substrate support 140 illustrated in FIG. 2.

Figure 11:
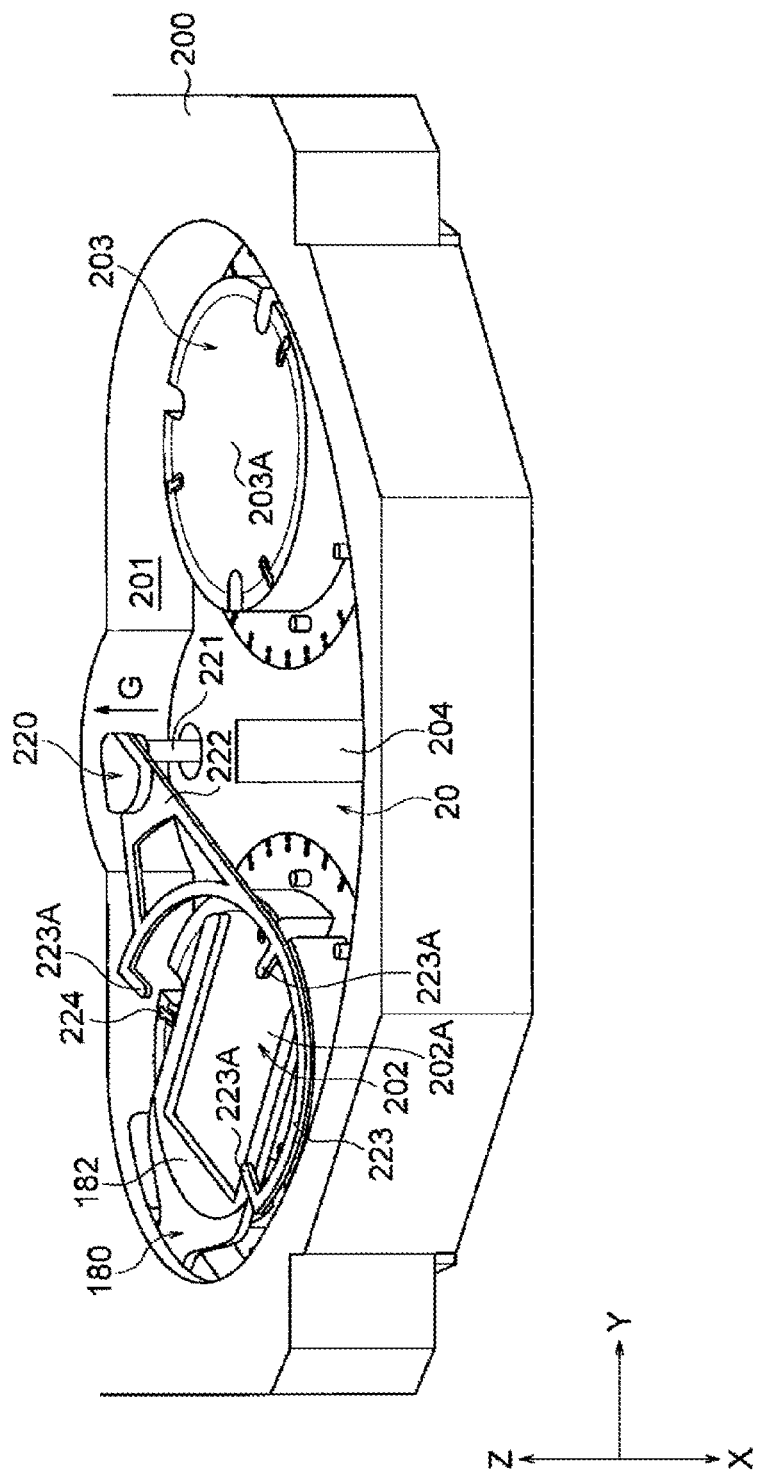
FIG. 11 is an enlarged perspective view corresponding to FIG. 4, illustrating a first step of a substrate processing method according to one embodiment of the present disclosure.

The substrates 24 stored in the substrate support 140 are transferred from the load lock chambers 14 and 16 to the reaction chamber 201 of the process chambers 20 and 22 illustrated in FIGS. 3 and 11 using the vacuum robot 180 of the transfer chamber 18 illustrated in FIG. 2. Since the finger portion 182 of the vacuum robot 180 includes the lower linger 183 and the upper finger 184, the two substrates 24 are simultaneously transferred onto the mounting surface 202A of the substrate mounting part 202 in the reaction chamber 201. Here, in FIGS. 11 to 13, the illustration of the substrates 24 is omitted in order to clarify the operation of the robot arm 220 and the like.

As illustrated in FIG. 11, the finger 223 of the robot arm 220 stands by between the two substrates 24 transferred onto the substrate mounting part 202 in the reaction chamber 201. Subsequently, the substrate holding pins 224 (see FIG. 5) disposed in the peripheral edge portion of the mounting surface 202A of the substrate mounting part 202 are lifted so that the substrates 24 transferred by the lower finger 183 of the vacuum robot 180 are transferred to the substrate holding pins 224. Meanwhile, the finger 223 of the robot arm 220 is lifted in the direction of the arrow G together with the lifting of the substrate holding pins 224 so that the substrates 24 transferred by the upper finger 184 of the vacuum robot 180 are transferred to the support portions 223A of the finger 223. Thereafter, the finger portion 182 of the vacuum robot 180 is returned to the transfer chamber 18. The substrate holding pins 224 are lowered and the substrate 24 transferred to the substrate holding pins 224 is mounted on the mounting surface 202A of the substrate mounting part 202.

Here, as illustrated in FIGS. 5 to 8, the temperature measurement part 40 is disposed in the storage part 225 of the substrate mounting part 202, and the leading end portion 42A of the temperature sensor 42 of the temperature measurement pan 40 protrudes from a mounting surface 202A. Therefore, when the substrate 24 is held on the mounting surface 202A, the leading end portion 42A makes contact with the rear surface of the substrate 24, and the leading end portion 42A is elastically deformed downward from the mounting surface 202A in a state in which the leading end portion 42A makes contact with the rear surface of the substrate 24 due to the weight of the substrate 24 itself. Here, the leading end portion 42A is stored in the storage part 225. Then, the temperature measurement of the substrate 24 begins by the temperature sensor 42, and the measurement result is sent to the controller 30 illustrated in FIG. 1.

Figure 12:
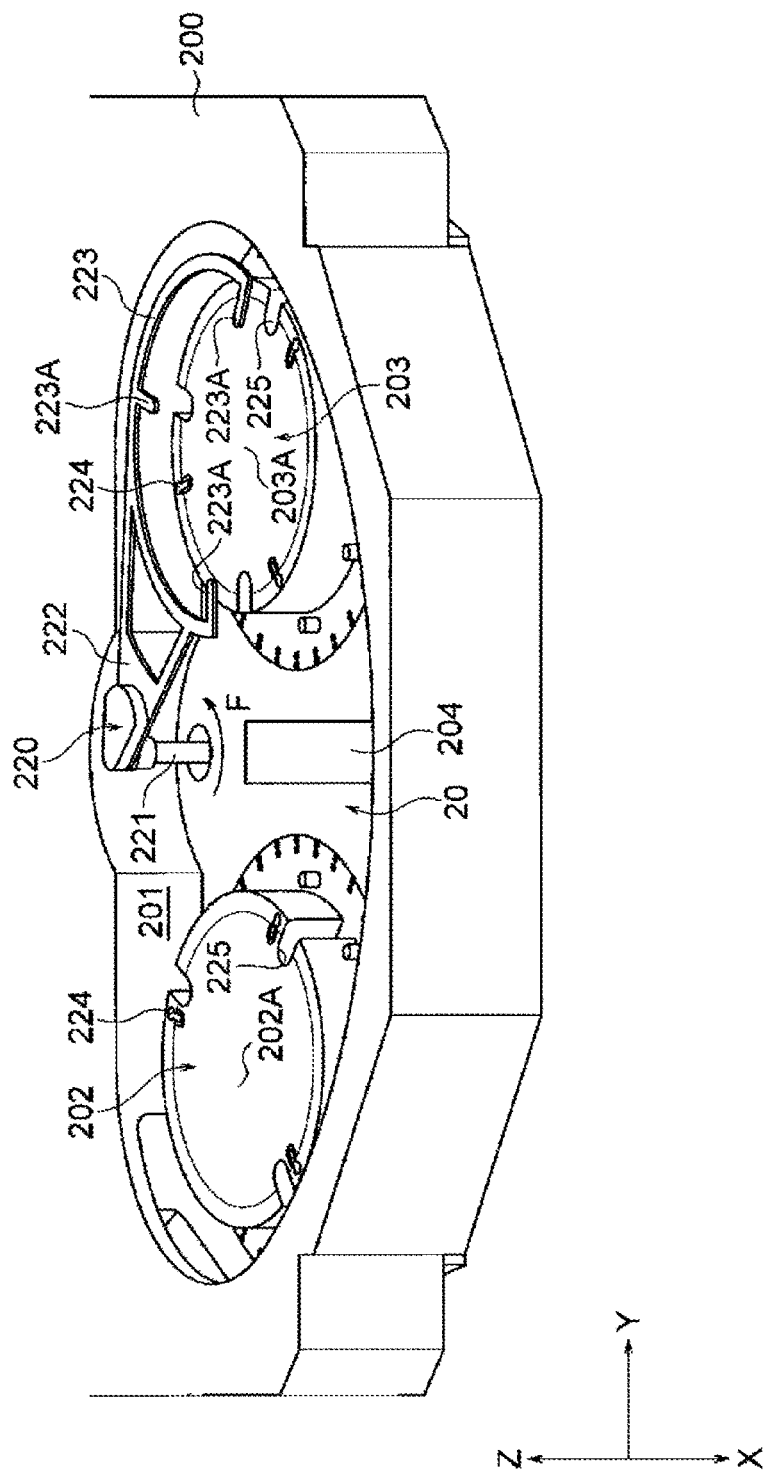
FIG. 12 is an enlarged perspective view illustrating a second step.
Figure 13:
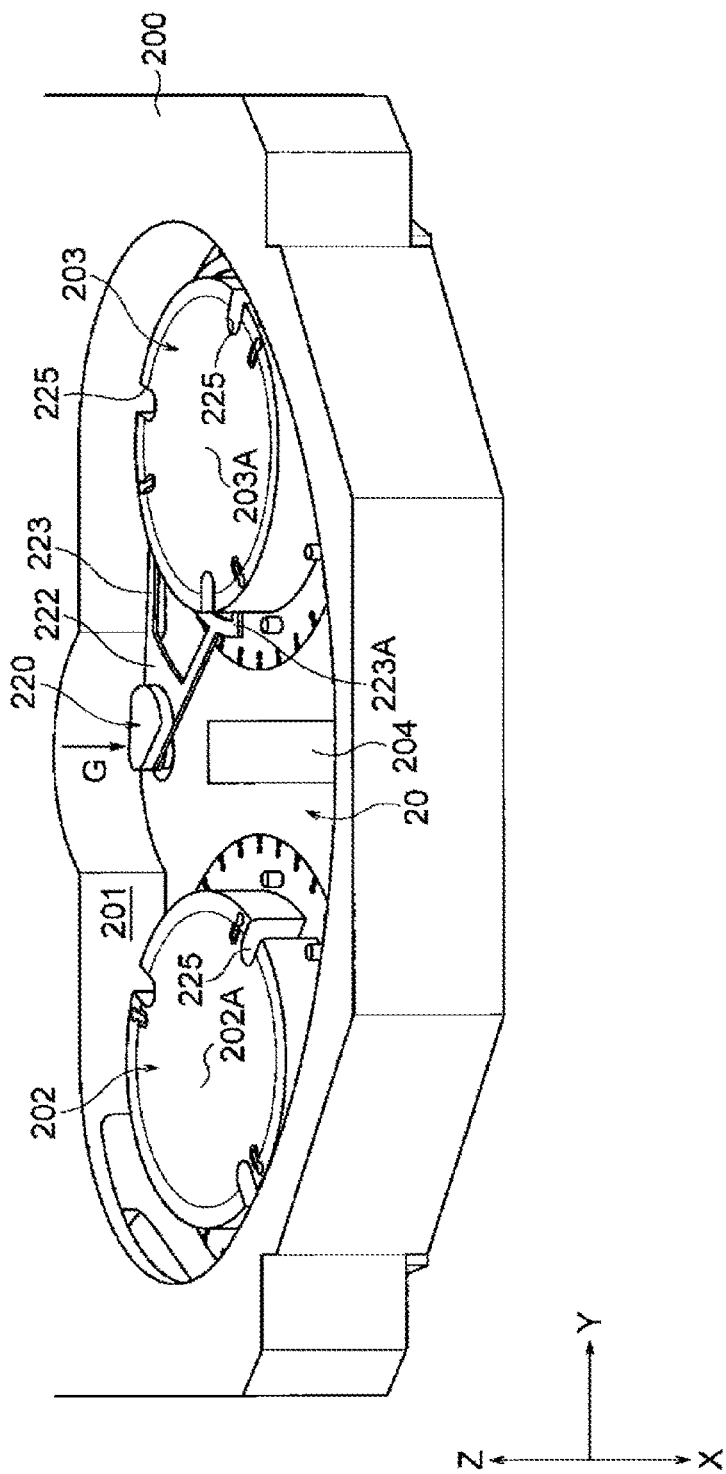
FIG. 13 is an enlarged perspective view illustrating a third step.

On the other hand, as illustrated in FIG. 12, the substrate 24 transferred to the finger 223 is transferred onto the mounting surface 203A of the substrate mounting part 203 by the rotation of the robot arm 220 in the direction of the arrow F. Then, as illustrated in FIG. 13, the finger 223 is lowered in the direction of the arrow G, so that the substrate 24 is mounted on the mounting surface 203A of the substrate mounting part 203. At this time, the support portion 223A of the lowered finger 223 is accommodated in the storage part 225 installed in the substrate mounting part 203. Since the temperature measurement part 40 is also similarly disposed in the substrate mounting part 203, the temperature measurement of the substrate 24 mounted on the mounting surface 203A begins.

Similar to the case where the substrate 24 is mounted on the mounting surface 202A, the substrate 24 may be mounted on the mounting surface 203A using the substrate holding pins 224 installed in the substrate mounting part 203. Even in this ease, the support portion 223A of the finger 223 is accommodated in the storage part 225 installed in the substrate mounting part 203.

The substrates 24 mounted on the mounting surface 202A and the mounting surface 203A are heated by the heating part 211 illustrated in FIG. 3. The substrates 24 are heated to, for example, 450 degrees C. In parallel with this heat treatment, a gas necessary for processing the substrates 24 is supplied from each of the supply pipes 207 and 208 to the reaction chamber 201. In the present embodiment, a nitrogen ($N_2$) gas or an oxygen ($O_2$) gas is supplied as the gas, and an insulating protective film is formed on the surfaces of die substrates 24. In the case of a non-contact temperature measuring method using a radiation thermometer (a pyrometer or the like), as described above, it is difficult to measure a temperature of the substrates 24 heated in the low temperature range. On the other hand, the temperature measuring method using the temperature measurement part 40 of the present embodiment can be appropriately used, particularly when measuring a temperature band which is difficult to measure in the non-contact temperature measuring method, for example, a temperature of the substrates 24 heated to a temperature of a temperature band, of 500 degrees C. or lower.

Also, it may be configured to measure an in-plane temperature distribution of the substrates 24 mounted on each of the mounting surface 202A and the mounting surface 203A by arranging a plurality of temperature measurement parts 40 for each of the substrate mounting; part 202 and the substrate mounting part 203.

Here, in addition to the heating part 211, an auxiliary heating part may be disposed above the inside of the reaction chamber 201. When the auxiliary heating part is disposed, the time to reach the processing temperature is shortened, thereby improving the heating efficiency and expanding the processing temperature range. Also, in addition to the heating part 211, a high frequency coil may be disposed above the inside of the reaction chamber 201. The high frequency coil is connected to a high frequency power, and when a predetermined high frequency power is supplied to the high frequency coil, plasma can be generated. By generating the plasma, an ashing process or a plasma CVD process, can be performed on the substrates 24.

When the substrate processing of the substrates 24 is completed, the substrates 24 are transferred from the reaction chamber 201 to the atmospheric transfer chamber 12 by a procedure that is the reverse of the procedure of transferring from the atmospheric transfer chamber 12 to the process chambers 20 and 22. The transferred substrates 24 are accommodated in the carrier 26. In the substrate processing method, the substrate processing is performed on the two substrates 24 at the same time in each of the reaction chamber 201 of the process chamber 20 and the reaction chamber 201 of the process chamber 22, but the substrate processing may also be performed on one substrate 24 in one reaction chamber 201. The substrate processing described above is executed by the computer of the controller 30 according to the substrate processing program stored in the storage medium of the controller 30 illustrated in FIG. 1.

(Operation and Effects of the Present Embodiment)

As illustrated in FIGS. 5 to 8, the substrate processing apparatus 10 according to the present embodiment includes the temperature measurement part 40 having the elastically deformable temperature sensor 42 which protrudes from the mounting surface 202A and is installed in the substrate mounting part 202. The leading end portion 42A of the temperature sensor 42 makes contact with the rear surface of the substrate 24 only by mounting the substrate 24 on the mounting surface 202A and is bent by elastic deformation to surely bring the leading end portion 42A into contact with the rear surface of the substrate 24. Similarly, the substrate processing apparatus 10 includes the temperature measurement part 40 having the elastically deformable temperature sensor 42 which protrudes from the mounting surface 203A and is installed in the substrate mounting pan 203. The leading end portion 42A of the temperature sensor 42 makes contact with the rear surface of the substrate 24 only by mounting the substrate 24 on the mounting surface 203A and is bent by elastic deformation to surely bring the leading end portion 42A into contact with the rear surface of the substrate 24. Therefore, it is possible to easily improve the accuracy of the temperature measurement of the substrate 24, regardless of the film formation state of the substrate 24.

FIG. 14 illustrates a result of measuring a temperature of the substrate 24 using the temperature measurement part 40 according to the present embodiment and a result of measuring a temperature according to a comparative example. In FIG. 14, the horizontal axis indicates a substrate heating time (second) and the vertical axis indicates a substrate heating temperature (degrees C.). The measurement result about the comparative example is a result of measuring, a temperature using a substrate having a thermocouple, and is indicated by a solid line. Meanwhile, the measurement result of the temperature of the substrate 24 using the temperature measurement part 40 is indicated by a broken line, and is substantially the same as the measurement result according to the comparative example. That is, by the substrate processing apparatus 10 of the present embodiment, it is possible to measure the temperature with high accuracy comparable to the substrate having the thermocouple according to the comparative example.

Furthermore, in the substrate processing apparatus 10 according to the present embodiment, particularly, as illustrated in FIG. 7, the leading end portion 42A of the temperature sensor 42 of the temperature measurement part 40 makes contact with the rear surface of the substrate 24 mounted on the mounting surface 202A and is accommodated lower than the mounting surface 202A by elastic deformation. Similarly, the leading end portion 42A of the temperature sensor 42 makes contact with the rear surface of the substrate 24 mounted on the mounting surface 203A and is accommodated lower than the mounting surface 203A by elastic deformation. Therefore, the temperature measurement part 40 can measure the temperature with high accuracy using the temperature measurement part 40 without interrupting the mounting of the substrate 24 on the mounting surface 202A or the mounting surface 203A.

Furthermore, in the substrate processing apparatus 10 according to the present embodiment, the temperature sensor 42 of the temperature measurement part 40 is configured with the sheath thermocouple in which the thermocouple wire is inserted into the heat resistant metal pipe (see FIG. 7). Therefore, it is possible to measure the temperature with high accuracy by providing, particularly, the leading end portion 42A of the temperature sensor 42 with deflection.

In addition, in the substrate processing apparatus 10 according to the present embodiment, the heat resistant metal pipe of the sheath thermocouple is set to a diameter of 0.5 mm or less. By decreasing the diameter of the heat resistant metal pipe, the heat capacity of the temperature sensor 42 is reduced, thereby improving the transient responsibility of the temperature sensor 42. Therefore, it is possible to measure the temperature with high accuracy in a short time using the temperature measurement part 40.

Moreover, in the substrate processing, apparatus 10 according to the present embodiment, as illustrated in FIG. 7, the protrusion direction of the leading end portion 42A of the temperature sensor 42 is inclined with respect to the mounting surface 202A or the mounting surface 203A. Therefore, since the contact of the leading end portion 42A with the rear surface of the substrate 24 starts in an inclined state, the leading end portion 42A becomes easy to bend. That is, since the leading end portion 42A reliably makes contact with the rear surface of the substrate 24 by bending, it is possible to measure the temperature with high accuracy.

Furthermore, in the substrate processing apparatus 10 according to the present embodiment, as illustrated in FIG. 5, the storage part 225 for storing the support portion 223A of the finger 223 of the robot arm 220 as a transfer mechanism is disposed in the substrate mounting part 202 or 203, and the temperature sensor 42 of the temperature measurement part 40 is disposed in the storage part 225. Therefore, since the storage part 225 is used, the temperature measurement part 40 can be easily arranged. In addition, even if the temperature measurement part 40 is disposed, it is possible to prevent the substrate processing apparatus 10 from becoming larger.

Furthermore, in the substrate processing apparatus 10 according to the present embodiment, as illustrated in FIGS. 5 to 8, the temperature measurement part 40 is disposed by installing the temperature sensor 42 in the installation member 44 and fixing the installation member 44 inside the storage part 225. Therefore, the temperature sensor 42 can be easily fixed to the storage part 225 by the installation member 44.

In addition, in the substrate processing apparatus 10 according to the present embodiment, particularly, as illustrated in FIGS. 5 to 8D, the installation member 44 has the fixing portion 44D spaced apart from the groove wall of the storage part 225 of the substrate mounting part 202 or 203, and the temperature sensor 42 is installed in the fixing portion 44D. Therefore, since it is difficult to transmit a temperature, which becomes a measurement noise, from the substrate mounting part 202 or 203 to, particularly the leading end portion 42A of the temperature sensor 42, it is possible to measure the temperature with high accuracy. Furthermore, since the installation member 44 has a structure to be fixed by making contact with the U groove of the storage part 225 via the protrusion portions 44G, it is possible to reduce heat transmitted from the substrate mounting part 202 or 203 to the temperature sensor 42.

Furthermore, in the substrate processing apparatus 10 according to the present embodiment, as illustrated in FIG. 3, since the heating part 211 is embedded in the substrate mounting part 202 or 203 in the process chambers 20 and 22, it is possible to realize the compact reaction chamber 201.

Moreover, the substrate processing method according to the present embodiment includes a process of mounting the substrate 24 on the mounting surface 202A of the substrate mounting part 202 or on the mounting surface 203A of the substrate mounting pan 203. In addition, the substrate processing method includes a process of bringing the temperature sensor 42 of the temperature measurement part 40 protruding from the mounting surface 202A or the mounting surface 203A into contact with the substrate 24 to be elastically deformed lower than the mounting surface 202A or the mounting surface 203A. Therefore, since the leading end portion 42A of the temperature sensor 42 and the rear surface of the substrate 24 reliably make contact with each other, it is possible to provide the substrate processing method capable of easily improving the accuracy of the temperature measurement of the substrate 24 regardless of the film formation state of the substrate 24.

Furthermore, in the method of manufacturing a semiconductor device, the substrate processing program, and the recording medium according to the present embodiment, the same operational effects as those achieved by the substrate processing method according to the present embodiment can be achieved.

Other Embodiments

The present disclosure is not limited to the aforementioned embodiment and may be differently modified without departing from the spirit of the present disclosure. For example, the present disclosure may be configured to form the leading end portion of the temperature sensor of the temperature measurement part with high rigidity such that it is difficult to be deformed, make the leading end portion rotatable, and to maintain the protrusion state of the leading end portion on the mounting surface using an elastic member such as a spring. In this case, when the substrate is mounted on the leading end portion, since the elastic, member bends due to the weight of the substrate itself, the state in which the leading end portion makes contact with the rear surface of the substrate is maintained.

Furthermore, in the present disclosure, the temperature measurement part may be disposed outside the substrate mounting part without using the storage part of the support portion of the finger. In addition, a separate recess (including a through hole, a notch, or the like) different from the storage part of the support portion of the linger may be installed in the substrate mounting part so that the temperature measurement part may be disposed in the recess.

Moreover, in the present disclosure, the temperature sensor may be formed in a cylindrical coil shape (spiral shape) so as to provide a spring property (elasticity) in the longitudinal direction of the cylinder. By mounting the substrate on the leading end portion of the temperature sensor has the cylindrical coil shape, it is possible to maintain the state in which the leading end portion makes contact with the rear surface of the substrate by deflecting the temperature sensor by the weight of the substrate itself.

According to the present disclosure in some embodiments, it is possible to provide a technique capable of easily improving the accuracy of temperature measurement of a substrate, regardless of a film formation state of the substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a substrate mounting table having a mounting surface on which a substrate is mounted;
a heater configured to heat the substrate mounted on the mounting surface;
an elastically deformable temperature sensor whose leading end portion constitutes a temperature detection part; and
a substrate transfer mechanism including an arm configured to hold the substrate, the substrate transfer mechanism configured to transfer the substrate held by the arm onto the mounting surface,
wherein the temperature sensor is configured to extend from below the mounting surface to above the mounting surface, and the leading end portion protrudes from the mounting surface,
wherein the substrate mounting table includes a recess or a notch portion configured to accommodate at least a portion of the arm, and
wherein the temperature sensor is installed such that the temperature sensor extends from the inside of the recess or the notch portion to above the mounting surface, and the leading end portion protrudes from the mounting surface.

2. The apparatus of claim 1, wherein when the substrate is mounted on the mounting surface, the temperature sensor is configured to be elastically deformed such that the leading end portion makes contact with a rear surface of the substrate and a portion protruding from the mounting surface is accommodated below the mounting surface.

3. The apparatus of claim 2, wherein when the substrate is mounted on the mounting surface, the temperature sensor is configured to be elastically deformed only by a weight of the substrate itself such that the portion protruding from the mounting surface is accommodated below the mounting surface.

4. The apparatus of claim 2, wherein the temperature sensor is configured with a sheath thermocouple.

5. The apparatus of claim 4, wherein when the substrate is mounted on the mounting surface, the temperature sensor is configured such that the sheath thermocouple itself is elastically deformed.

6. The apparatus of claim 1, wherein the temperature sensor is configured with a sheath thermocouple.

7. The apparatus of claim 6, wherein the temperature sensor is configured such that the sheath thermocouple itself is elastically deformed.

8. The apparatus of claim 6, wherein a diameter of the sheath thermocouple is 0.5 mm or less.

9. The apparatus of claim 6, wherein a portion of the sheath thermocouple protruding from the mounting surface is installed to be inclined with respect to the mounting surface.

10. The apparatus of claim 1, wherein the temperature detection part of the temperature sensor is installed to protrude from the inside of one of a recess, a notch portion, and a through hole, which are formed in the substrate mounting table, to above the mounting surface, wherein an installation member configured such that the temperature sensor is fixed to the installation member is installed in the inside of one of the recess, the notch portion, and the through hole, and wherein the installation member includes a protrusion-shape support portion, and the installation member is configured to be fixed to the substrate mounting table via the support portion.

11. The apparatus of claim 10, wherein the heater is installed in the substrate mounting table.

12. A temperature measurement unit installed in a substrate mounting table having a mounting surface on which a substrate is mounted so that a substrate transfer mechanism includes an arm configured to hold the substrate to transfer the substrate held by the arm onto the mounting surface, wherein the temperature measurement unit comprises:
an elastically deformable temperature sensor whose leading end portion constitutes a temperature detection part,
wherein the temperature sensor is configured to extend from below the mounting surface to above the mounting surface, and the leading end portion protrudes from the mounting surface,
wherein the substrate mounting table includes a recess or a notch portion configured to accommodate at least a portion of the arm, and
wherein the temperature sensor is installed such that the temperature sensor extends from the inside of the recess or the notch portion to above the mounting surface, and the leading end portion protrudes from the mounting surface.

13. The temperature measurement unit of claim 12, wherein the temperature sensor is configured with a sheath thermocouple.

* * * * *